(12) United States Patent
Sunwoo et al.

(10) Patent No.: US 6,965,281 B2
(45) Date of Patent: Nov. 15, 2005

(54) FBAR, FBAR BASED DUPLEXER DEVICE AND MANUFACTURING METHOD THEREOF

(75) Inventors: Kook Hyun Sunwoo, Choongchungnam-do (KR); Jong Oh Kwon, Kyungki-do (KR)

(73) Assignee: Samsung Electro-Mechanics Co., ltd., Kyungki-Do (KR)

( * ) Notice: Subject to any disclaimer, the term of this patent is extended or adjusted under 35 U.S.C. 154(b) by 0 days.

(21) Appl. No.: 10/756,318

(22) Filed: Jan. 14, 2004

(65) Prior Publication Data

US 2005/0062558 A1 Mar. 24, 2005

(30) Foreign Application Priority Data

Sep. 24, 2003 (KR) .................................. 10-2003-0066202

(51) Int. Cl.[7] .......................... H03H 9/10; H03H 3/02; H03H 9/70; H03H 9/56
(52) U.S. Cl. ...................... 333/133; 333/187; 333/191; 333/192; 333/189; 438/106; 438/50; 438/113; 257/678; 257/704
(58) Field of Search ................................ 333/186–192, 333/133; 438/106, 50, 113; 257/678, 704

(56) References Cited

U.S. PATENT DOCUMENTS

| | | | | |
|---|---|---|---|---|
| 5,872,493 A | * | 2/1999 | Ella ........................... | 333/191 |
| 6,377,137 B1 | * | 4/2002 | Ruby ......................... | 333/189 |
| 6,407,649 B1 | | 6/2002 | Tikka et al. ................. | 333/133 |
| 6,509,813 B2 | * | 1/2003 | Ella et al. .................... | 333/187 |
| 6,838,956 B2 | * | 1/2005 | Bradley ...................... | 333/189 |

FOREIGN PATENT DOCUMENTS

KR 2003-54244 A 7/2003

OTHER PUBLICATIONS

D. Feld et al., "A Wafer Level Encapsulated FBAR Chip Molded Into A 2.0 mm×1.6 mm Plastic Package for Use As A PCS Full Band Tx Filter", 2003 IEEE Symposium on Ultrasonics, vol. 2, pp. 1798–1801, Oct. 2003.*

* cited by examiner

*Primary Examiner*—Barbara Summons
(74) *Attorney, Agent, or Firm*—Lowe Hauptman & Berner, LLP (57) ABSTRACT

Disclosed herein is a film bulk acoustic resonator (FBAR), an FBAR based duplexer device, and a manufacturing method thereof, which a plurality of sacrificial layer units are formed on a substrate wafer so as to be spaced apart from one another at regular distances, and device functional portions are formed on the sacrificial layer units, respectively. The device functional portions have a piezoelectric layer unit and a plurality of electrodes. Then, side wall and roof of protective formed by the use of dry film. After hardening the dry film, the wafer is cut into a plurality of the wafer sections so as to contain the device functional portions, respectively.

15 Claims, 8 Drawing Sheets

PRIOR ART

FIG. 1a

PRIOR ART

FBAR, FBAR BASED DUPLEXER DEVICE AND MANUFACTURING METHOD THEREOF

BACKGROUND OF THE INVENTION

1. Field of the Invention

The present invention relates to a film bulk acoustic resonator (hereinafter, referred to as an FBAR), and an FBAR based device, such as a duplexer, and more particularly to an FBAR, an FBAR based device, and a manufacturing method thereof, which can achieve miniaturization, and reduction of a manufacturing cost and enhancement of a yield due to a simplified process.

2. Description of the Related Art

In recent years, wireless communication devices have tended to become much leaner, and enhanced and diversified in their quality and functions due to the development of the communication industry. This recent trend sincerely requires miniaturization and enhancement in quality related with various elements for use in the wireless communication devices.

In order to satisfy such requirements to miniaturization, therefore, currently, active development is targeting studies for manufacturing essential components of wireless communication devices, such as a filter and a duplexer, by using FBARs. The FBARs are preferable for integration due to their thin film shapes, and have good properties.

Typically, the FBARs are usually formed in such a fashion that a piezoelectric layer is formed on a wafer, and upper and lower electrodes are formed at the upper and lower surfaces of the piezoelectric layer, respectively, for applying electricity to the piezoelectric layer so as to induce oscillation thereof. Further, a desired air gap is formed at the lower surface of the piezoelectric layer in order to improve a resonance property of the piezoelectric layer.

Figure 1A:
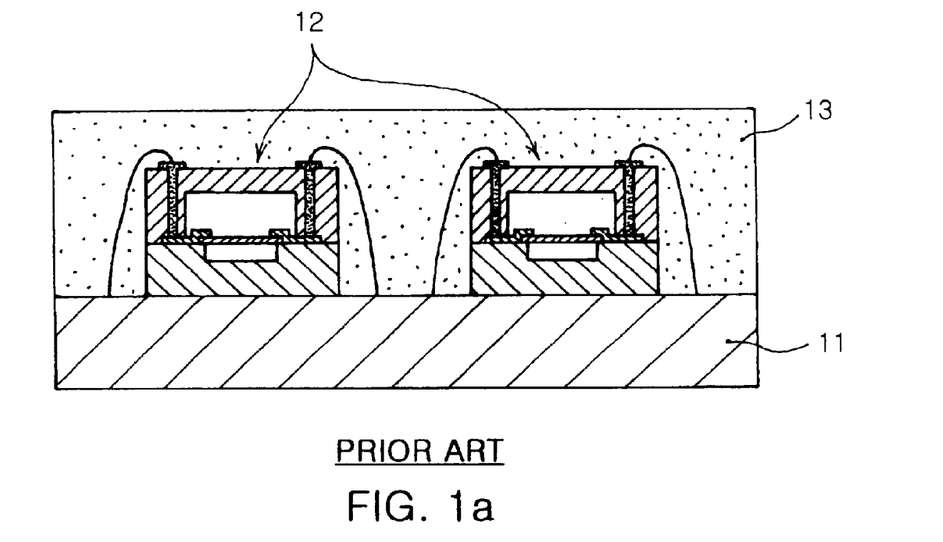
FIGS. 1A and 1B are sectional views, respectively, illustrating conventional FBAR based duplexer devices.
Figure 1B:
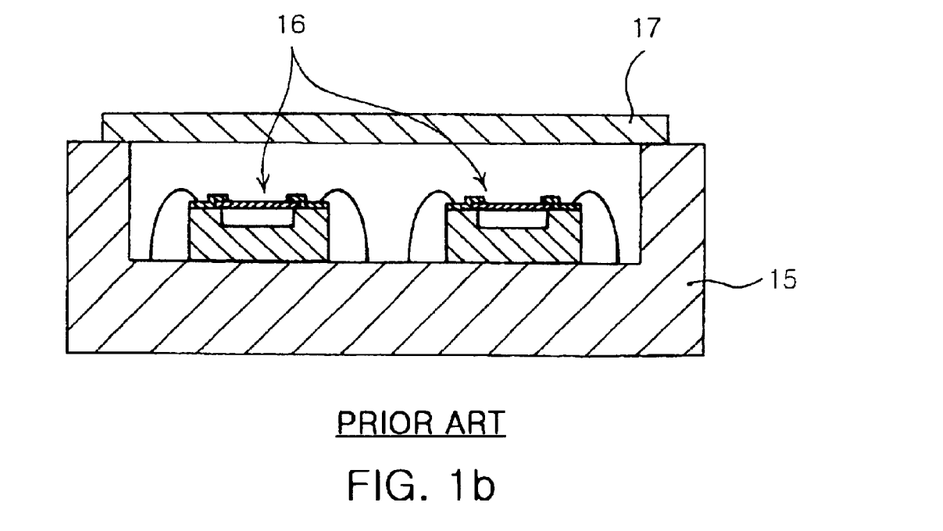

FIGS. 1A and 1B are sectional views, respectively, illustrating different structures of conventional duplexer devices implemented by using the FBARs formed as stated above.

The conventional FBAR based duplexer device shown in FIG. 1A comprises at least two FBARs 12, mounted on a substrate 11 serving as a lower support, for forming a Tx (transmitter) filter and an Rx (receiver) filter, respectively. The substrate 11 is formed with a common terminal and transmission/receiving terminals, and circuit patterns for electrically connecting the terminals to the Tx and Rx filters implemented by the FBARs. After the FBARs 12 are electrically connected to the circuit patterns formed at the substrate 11, in order to achieve a complete sealing of all of the FBARs 12, a molding portion 13 is formed on the substrate 11 by the use of certain sealing material.

As the substrate 11, due to the complexity of implemented circuits thereof, printed circuit board (PCB) type or low temperature co-fired ceramic (LTCC) type substrates are mainly used, but the PCB substrates are more preferable since they have many advantages, such as a low price, good properties and high productivity. In case of using the PCB substrates, as shown in FIG. 1A, it is necessary to provide certain protective structures on the FBARs 12, respectively, for protecting device functional portions, that is, piezoelectric layers, air gaps, and electrode layers, of the FBARs 12 from a molding process. These protective structures may be formed, for example, by processing a wafer having a certain thickness according to a wafer level package (WLP) technique, and bonding the processed wafer onto a substrate wafer of a corresponding FBAR.

In case that the FBARs 12 are formed with the protective structures, respetively, as stated above, however, the overall structure and manufacturing process of the FBARs 12 are disadvantageously complex, since the protective structures should be configured so as to be electrically connected to the device functional portions inside the FBARs 12, respectively, as well as protect the device functional portions.

When an FBAR is bonded to a substrate obtained by a wafer level package process, the obtained wafer level package type FBAR device has a very small size of about 1 millimeter in length and width. Due to the small size, a cap and substrate constituting the package has a sealing area corresponding to only about 30 to 100 square micrometers, with the exception of a driving portion. Since the FBAR device can endure only about 30° C. during its bonding process, there is a considerable restriction in a sealing method for securing a good reliability.

Even when a large amount of the FBAR devices are produced through any precision processes, due to a complexity in process thereof, it is difficult to obtain an appropriate yield.

In case that an LTCC technique is adopted in order to eliminate the above problems, as shown in FIG. 1B, first, a plurality of ceramic sheets are vertically laminated so as to form an LTCC substrate 15, which is defined therein with a cavity, and then a plurality of FBARs 16 are mounted inside the cavity defined in the LTCC substrate 15. After electrically connecting the FBARs 16 to the substrate 15 by bonding wires therebetween, a metal lead 17 is fused or seam-sealed on the LTCC substrate 15 above the FBARs 16.

In this case, since the LTCC substrate 15 is configured in such a fashion that circuits having a duplexing function are arranged therein in a multi-stage form, it is possible to achieve a reduction in size, compared with the case of using a single layer PCB substrate. Further, the LTCC substrate does not need a molding process. Furthermore, according to the structure of the LTCC substrate 15 as stated above, the LTCC substrate 15 already owns certain protective structures for protecting the FBARs 16. The protective structures are side walls obtained by defining the cavity in the substrate 15. Therefore, the LTC substrate 15 does not need separate protective structures. That is, the FBARs 16 only comprise an air gap, piezoelectric layer and electrode layers vertically arranged in series on an FBAR substrate wafer.

The LTCC technique, however, causes torsion of the LTCC substrate 15 during a LTCC firing process, resulting in a serious leak problem due to inferior bonding between the lead 17 and the LTCC substrate 15. Further, due to the fact that the LTCC substrate 15 is formed by vertically laminating a plurality of the ceramic sheets, there is a high possibility of producing any defects in the LTCC substrate itself.

Although the above techniques have been achieved according to a most effective method for miniaturization, since a possibility of inferiority due to complex processes always exists, it is difficult to secure a profit margin required for mass production, causing an unnecessarily high manufacturing cost, and to increase a possibility of producing inferior products due to an operator's carelessness.

SUMMARY OF THE INVENTION

Therefore, the present invention has been made in view of the above problems, and it is an object of the present invention to provide an FBAR, an FBAR-based device, and a manufacturing method thereof, which can achieve miniaturization, and reduction of a manufacturing cost and enhancement of a yield due to a simplified process.

In accordance with one aspect of the present invention, the above and other objects can be accomplished by the provision of a method for manufacturing FBARs comprising the steps of: a) preparing a wafer; b) forming a plurality of sacrificial layer units on the wafer, the sacrificial layer units being spaced apart from one another at regular distances; c) forming device functional portions on the sacrificial layer units, respectively, each device functional portion having a piezoelectric layer unit, and a plurality of electrodes; d) forming side walls by the use of a first dry film, the side walls being configured to surround the device functional potions formed on the wafer; e) forming air gaps by removing the sacrificial layer units, respectively; f) laminating a second dry film over the side walls, thereby forming roofs of resulting individual packages; g) hardening the first and second dry films forming the side walls and roofs; and h) cutting the wafer on the basis of plural vertical and horizontal lines. According to the method as stated above, it is possible to achieve the formation of protective structures for protecting the device functional portions from a molding process, with a simplified structure and process.

In accordance with another aspect of the present invention, there is provided a method for manufacturing FBARs comprising the steps of: a) preparing a wafer, b) dividing the wafer into a plurality of wafer sections by the use of vertical and horizontal lines, and forming a plurality of sacrificial layer units on the divided wafer sections, respectively; c) forming device functional portions on the sacrificial layer units, respectively, each device functional portion including a piezoelectric layer unit and a plurality of internal electrodes, which are vertically arranged on the sacrificial layer unit, and forming a plurality of external electrodes on the divided wafer sections, the external electrodes being electrically connected to the internal electrodes and positioned close to boundary lines of the wafer sections; d) forming side walls by the use of a first dry film, the side walls being configured to surround the device functional potions, respectively; e) forming air gaps by removing the sacrificial layer units, respectively; f) laminating a second dry film over the side walls; g) removing certain portions of the second dry film on the basis of the boundary lines between the adjacent wafer sections; h) hardening the first and second dry films; and i) cutting the wafer along the boundary lines between the divided adjacent wafer sections.

Preferably, the step c) may include the steps of: c-1) forming a plurality of lower internal electrodes and lower external electrodes positioned on the sacrificial layer units by applying a conductive material on the sacrificial layer units, respectively, the lower external electrodes being integrally formed with the lower internal electrodes, so as to be extended to and positioned at the boundary lines between the adjacent wafer sections; c-2) forming a plurality of the piezoelectric layer units by applying a piezoelectric material onto the lower internal electrodes positioned on the sacrificial layer units; and c-3) forming a plurality of upper internal electrodes and upper external electrodes positioned on the piezoelectric layer units, the upper external electrodes being integrally formed with the upper internal electrodes, so as to be extended to the boundary lines between the adjacent wafer sections.

Preferably, the step d) may include the steps of: d-1) forming protective layer units on a plurality of the device functional portions, respectively; d-2) laminating the first dry film on the wafer and the protective layer units; d-3) removing certain portions of the first dry film positioned on the protective layer units, respectively; and d-4) removing the protective layer units. According to the above method, it is possible to form the side walls made of dry films, without damage to the air gaps.

Preferably, the hardening step of the dry films may be performed by an ultraviolet exposure process and a heating process.

Preferably, the side walls may be made of a positive dry film, and the protective layer units may be made of a negative photo-resist, while the side walls may be made of a negative dry film, and the protective layer units may be made of a positive photo-resist. This enables the processing of a pattern.

In accordance with further another aspect of the present invention, there is provided a method for manufacturing an FBAR based duplexer device comprising the steps of: mounting at least two FBARs on a substrate; and forming a molding portion over the substrate and FBARs for the purpose of protection.

In accordance with yet another aspect of the present invention, there is provided an FBAR (film bulk acoustic resonator) comprising: a substrate having a certain size; a device functional portion formed at a center portion of the substrate while defining a certain air gap therein, thereby performing a resonance function by responding to electrical signals applied from the outside; a plurality of external electrodes formed on an upper surface of the substrate substantially coming into contact with both opposite edges of the upper surface, the external electrodes being electrically connected to the device functional portion; and a cap formed on the substrate, the cap including side walls configured to surround the device functional portion and a roof configured to cover over the side walls, the cap being formed by performing light-exposure, developing, and hardening processes of dry films.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, an FBAR, an FBAR-based device, and a manufacturing method thereof according to the present invention will be described, with reference to the accompanying drawings.

Figure 2:
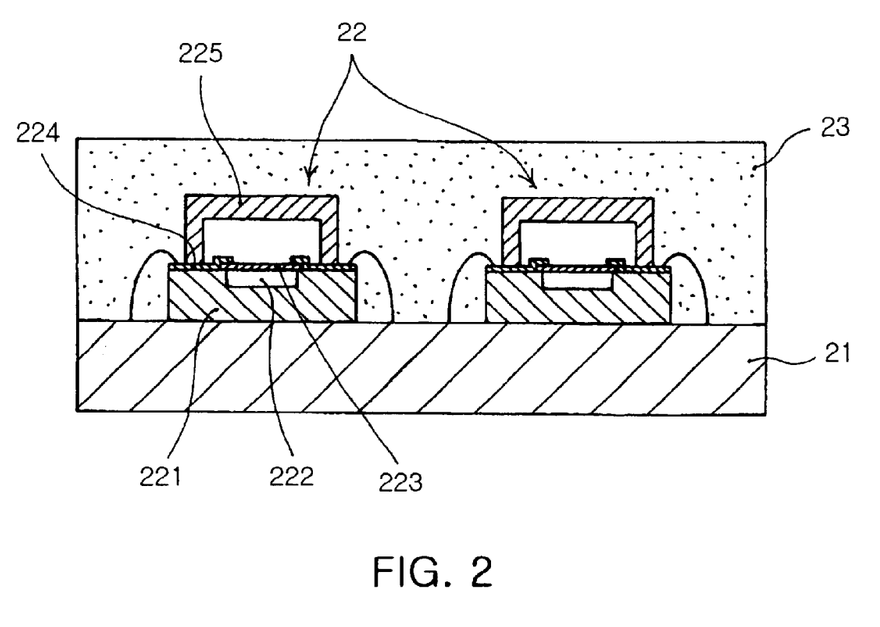
FIG. 2 is a sectional view illustrating an FBAR based duplexer device in accordance with the present invention.

Referring to FIG. 2 illustrating the sectional structure of the duplexer device implemented by using FBARs in accordance with the present invention, the FBARs and the FBAR based duplexer device will be explained.

As shown in FIG. 2, the FBAR based duplexer device of the present invention comprises a substrate 21 serving as a lower support, a plurality of FBARs 22 mounted on the substrate 21 and adapted to form Tx and Rx filters, respectively, and a molding portion 23 formed on the substrate 21 so as to enable a plurality of the FBARs 22 to be completely sealed. The substrate 21 is formed with a common terminal and transmission/receiving terminals and circuit patterns for electrically connecting the terminals to the Tx and Rx filters embodied by the FBARs 22, thereby allowing the FBARs 22 to be electrically connected to the substrate 21. The molding portion 23 is made of any sealing material.

The substrate 21 may be freely selected from among various kinds of substrates including PCB substrates or LTCC substrates so long as they allow the formation of circuits thereon, however, it is more preferable to use the PCB substrates in view of cost or productivity.

Each of the FBARs 22 basically comprises a certain sized substrate 221 defined therein with an air gap 222, a piezoelectric layer unit 223 formed on the substrate 221 so as to be positioned above the air gap 222, a plurality of electrodes 224 electrically connected with the piezoelectric layer unit 223 for performing input and output of signals, and a cap 225 bonded onto the substrate 221. The air gap 222, piezoelectric layer unit 223 and a plurality of the electrodes 224 form a device functional portion, which is adapted to perform a resonance function in correspondence to electrical signals applied from the outside. The cap 225 includes side walls configured to surround the air gap 222, piezoelectric layer 223 and a portion of the respective electrodes 224, and a roof covering over the side walls. The cap 225 is formed by performing light-exposure, developing, and hardening processes of dry films.

Considering the device functional portion, a portion of the respective electrodes 224 extends to the outer rim of the substrate 221 and is exposed without being sealed by the cap 225, thereby serving as an external electrode for use in a subsequent wire bonding process.

Therefore, the exposed portions of the electrodes 224 can be electrically connected to the circuits formed at the substrate 21 by bonding wires therebetween.

The cap 225 is obtained by processing an insulation film including a photosensitive polymer film or non-photosensitive polymer film. Since the cap 225 is molded and processed by general processes including laminating, light-exposure, developing, hardening, and the like, it is possible to achieve precision processing thereof, and to simplify its overall process compared with a wafer level package thus reducing the rate of generation of inferior products. Further, in comparison with the wafer level package having a complexity in its process, a yield and productivity thereof are improved while an overall manufacturing cost is reduced.

In order to protect the device functional portions, that is, the air gaps 222, piezoelectric layers 223 and a plurality of the electrodes 224, of the FBARs from a molding process, the FBAR based duplexer device of the present invention embodies protective structures by the use of a dry film as the insulation film as stated above, thereby simplifying the structure of the protective structures compared with other FBAR based duplexer devices implemented by using conventional PCB substrates. As a result, it is possible to reduce the rate of generation of inferior products. Further, even compared with FBAR based duplexer devices implemented by using conventional LTCC substrates, it is possible to achieve a simplification in the overall process thereof and a reduction in the rate of generation of inferior products thus increasing a yield in the case of mass production.

Now, a manufacturing method of the FBARs and the FBAR based duplexer device in accordance with the present invention will be explained with reference to FIGS. 3A to 3M illustrating the sequential steps thereof.

Figure 3A:
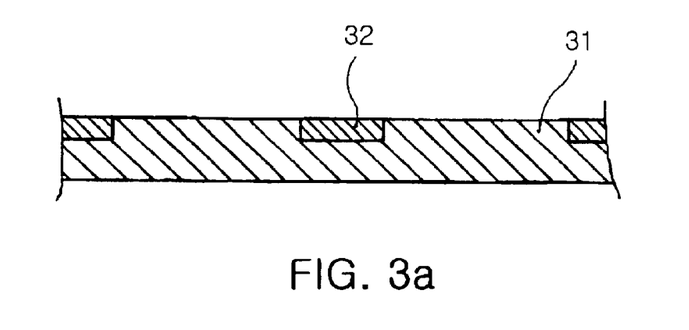
FIGS. 3A–3M are sectional views, respectively, illustrating the sequential steps of manufacturing FBARs and the FBAR based duplexer device in accordance with the present invention.
Figure 3B:
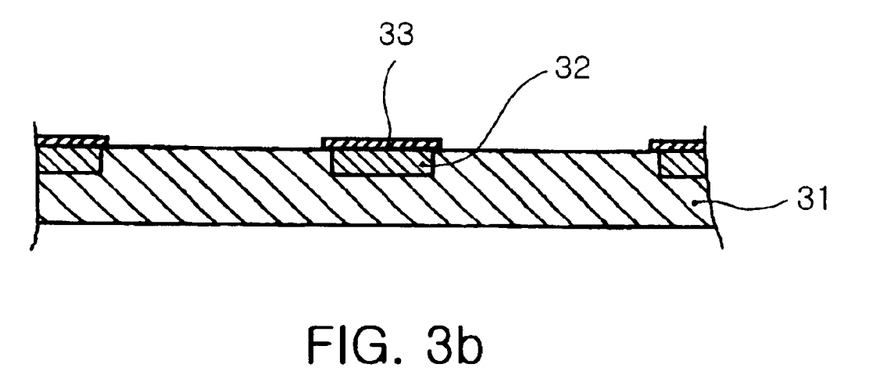
Figure 3C:
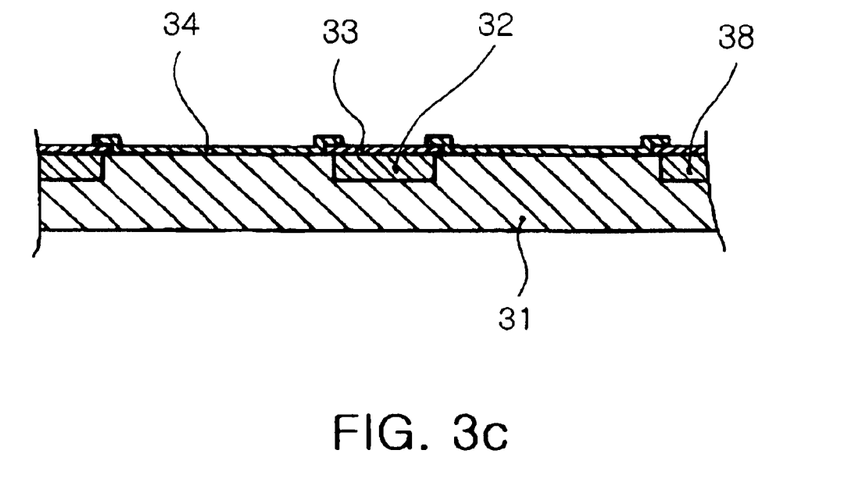
Figure 3D:
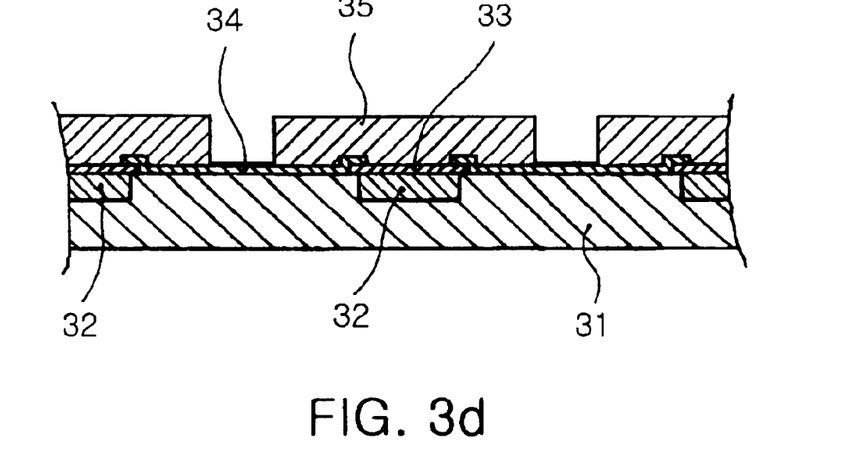
Figure 3E:
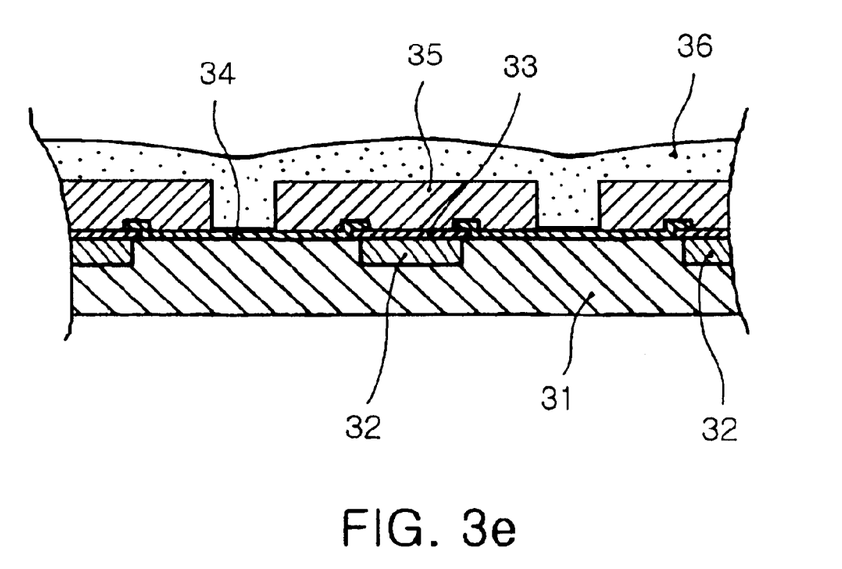
Figure 3F:
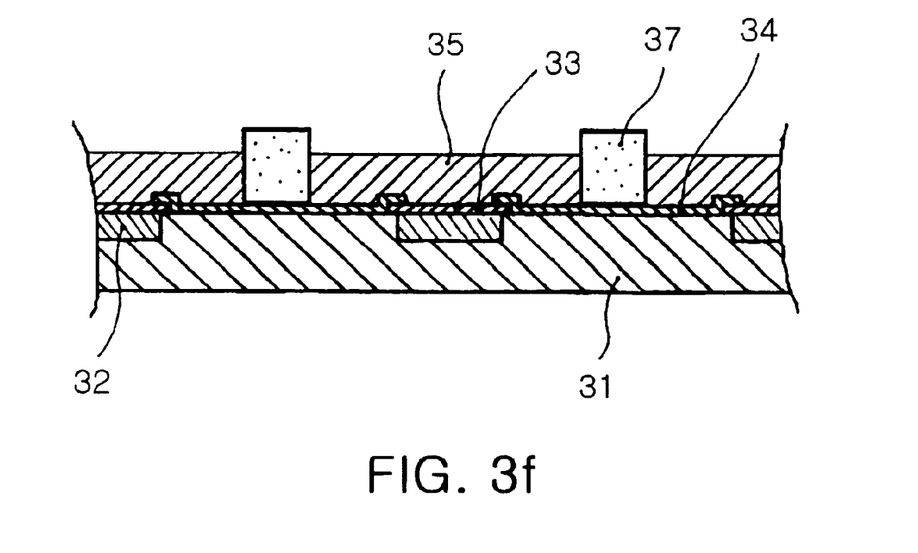
Figure 3G:
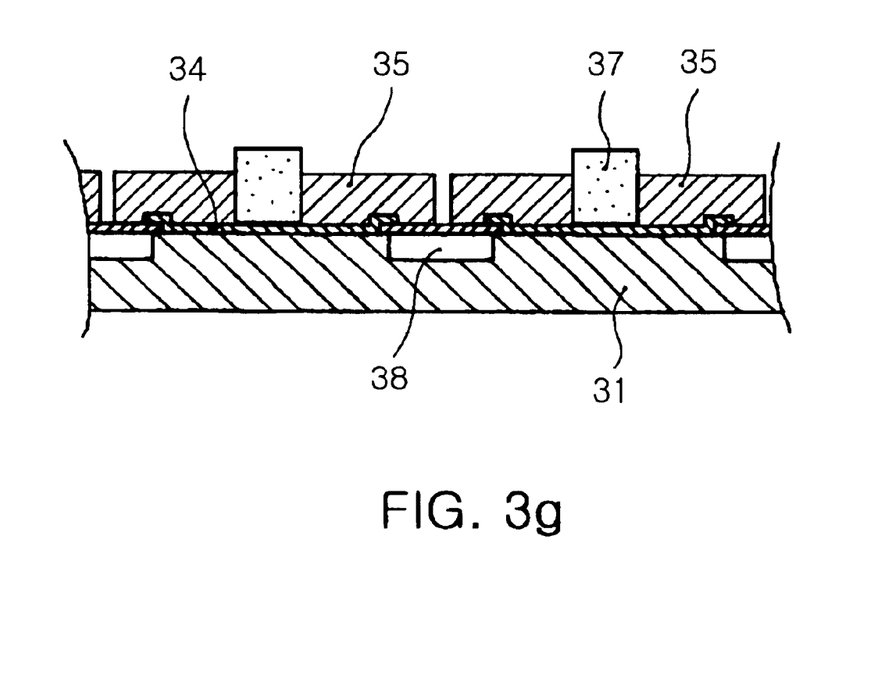
Figure 3H:
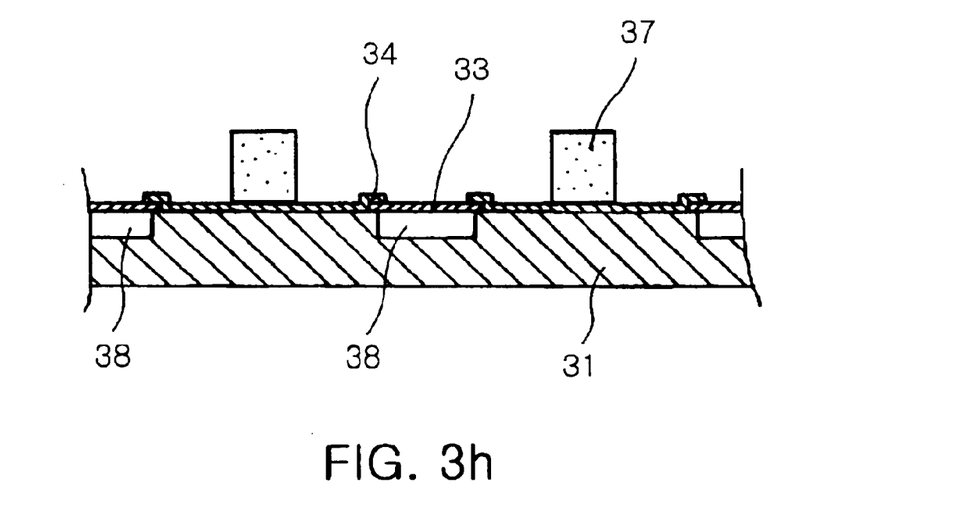
Figure 3I:
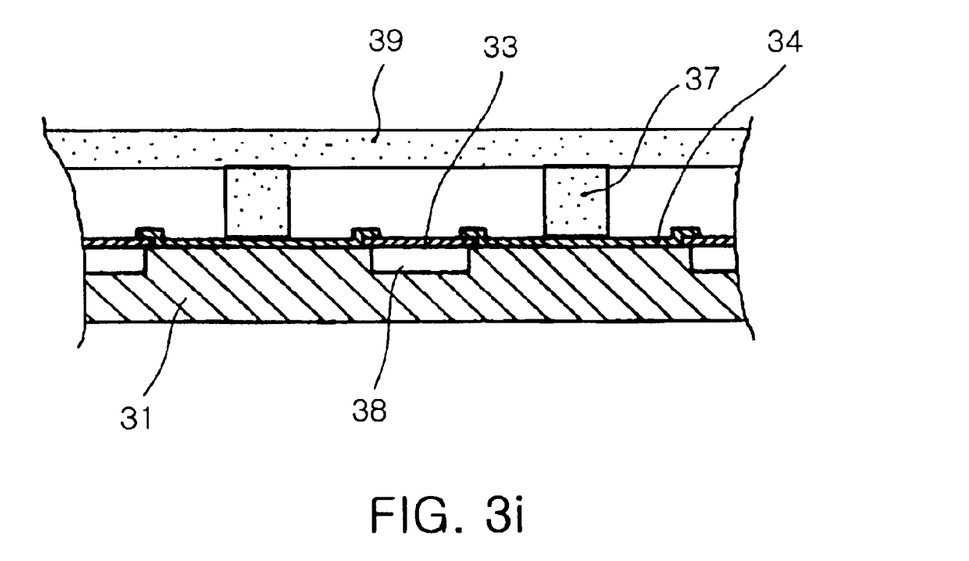
Figure 3J:
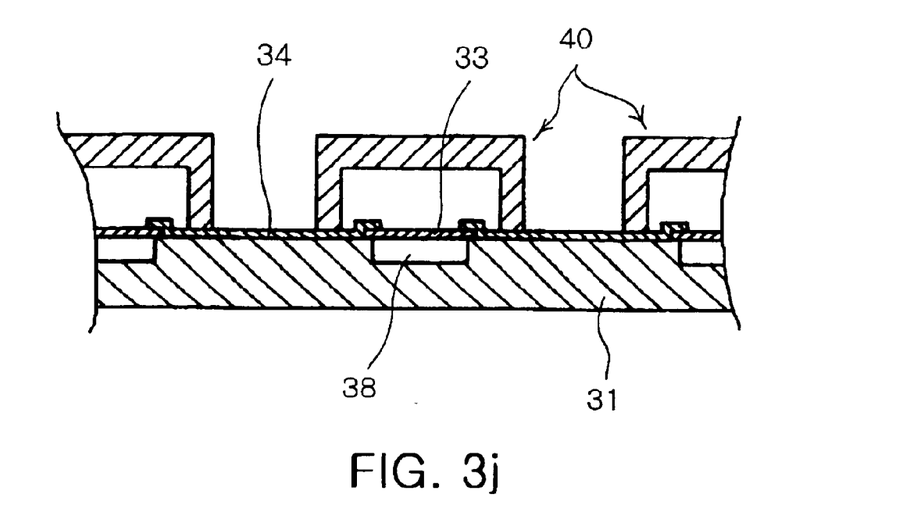
Figure 3K:
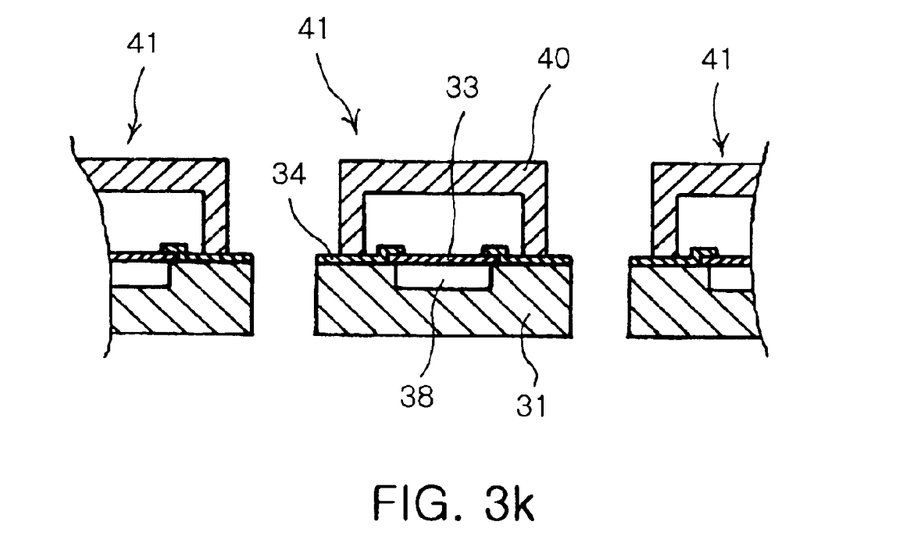
Figure 3L:
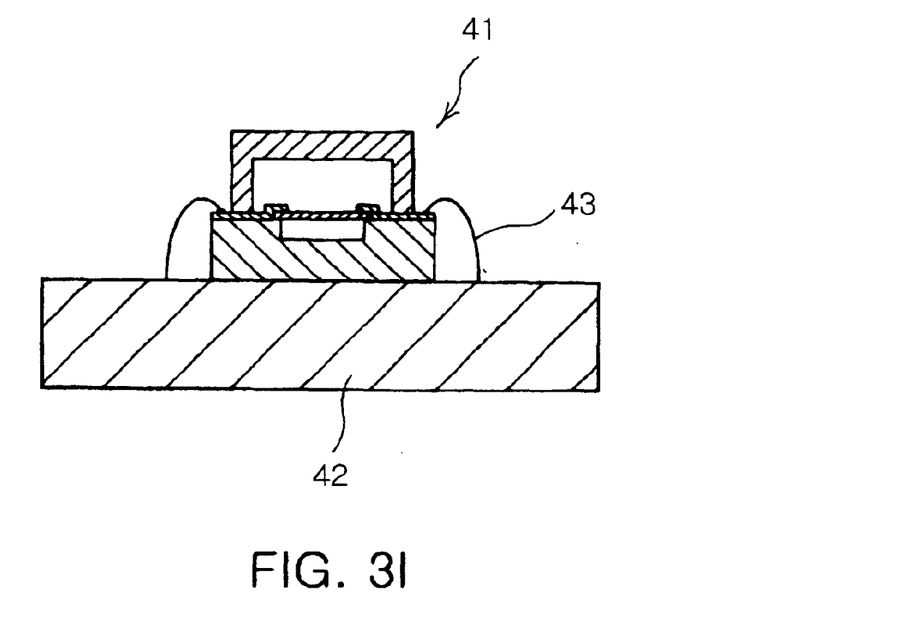
Figure 3M:
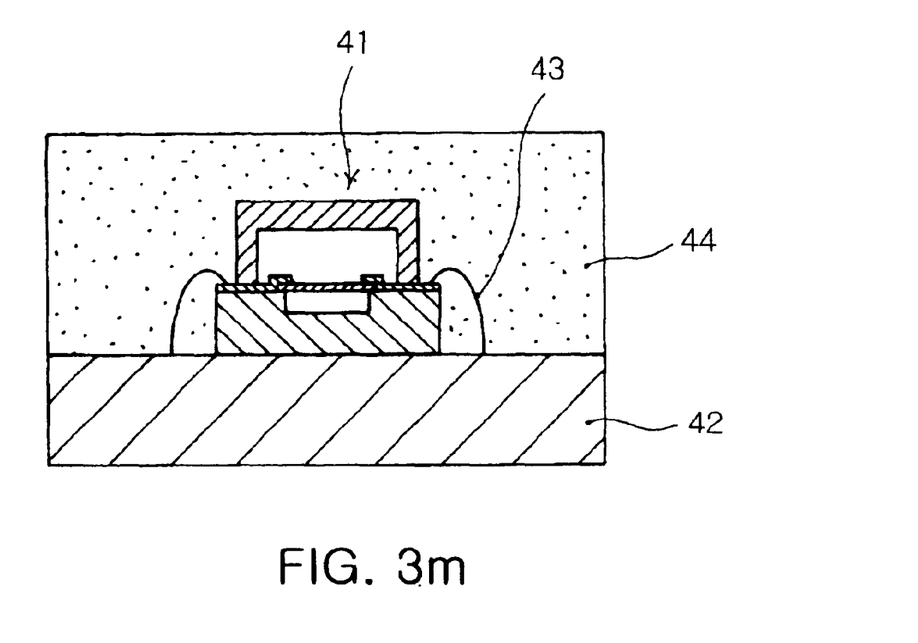

FIGS. 3A to 3K correspond to a manufacturing process of the FBARs, and FIGS. 3L to 3M correspond to a manufacturing process of the duplexer device implemented by using the FBARs.

According to the manufacturing method of the present invention, a plurality of the FBARs can be simultaneously manufactured by dividing a substrate wafer 31, having a wide area, into a plurality of substrate sections by the use of vertical and horizontal lines, so as to allow each substrate section to form an individual chip.

For this, first, a plurality of sacrificial layer units 32 are formed on the substrate wafer 31 so as to be spaced apart from one another at regular distances. That is, after the overall surface area of the substrate wafer 31 is divided into a plurality of the substrate sections by the use of the vertical and horizontal lines, the sacrificial layer units 32 are positioned so that they are centrally disposed on the divided substrate sections, respectively. In this case, the adjacent sacrificial layer units 32 define constant gaps therebetween in all directions. The formation of the sacrificial layer units 32 may be performed by the use of various processes.

After completing the formation of the sacrificial layer units 32, as shown in FIG. 3B, certain piezoelectric material is applied onto the sacrificial layer units 32 by a certain thickness so as to form piezoelectric layer units 33 on the sacrificial layer units 32 in a one to one ratio. Each of the resulting piezoelectric layer units 33 has a cross sectional area slightly larger than that of the sacrificial layer unit 32.

Then, as shown in FIG. 3C, a plurality of electrodes 34 are formed at the upper surface of the substrate wafer 31 so that a portion of each electrode 34 is stacked on a certain portion of the piezoelectric layer unit 33 adjacent thereto. Alternately, according to the formation position thereof, the electrodes 34 may be previously formed before the formation of the piezoelectric layer units 33. Considering the formation of a plurality of the electrodes 34, one end of each electrode, at the opposite side of the portion stacked on the adjacent piezoelectric layer unit 33, extends to a boundary line between adjacent ones of the divided substrate sections, thereby allowing an internal electrode to be electrically connected to the adjacent piezoelectric layer unit 33 and an external electrode for use in a subsequent wire bonding, to be simultaneously formed.

In a state wherein the electrodes 34 are formed, as shown in FIG. 3D, photo-resist layer units 35 are formed by applying photo-resist onto certain regions, respectively, where the piezoelectric layer units 33 and sacrificial layer units 32 are vertically arranged, thereby forming device functional portions generating mechanical oscillation. The photo-resist layer units 35 serve to protect the device functional portions from a subsequent process, as well as to enable a pattern molding during the formation of side walls using a dry film.

In the next step, a dry film 36 is laminated on the substrate wafer 31 formed with the photo-resist layer units 35. The dry film 36 is preferably selected from among dry films having a photosensitivity as opposed to that of the photo-resist layer units 35. For example, if the photo-resist layer units 35 are made of a positive photo-resist, a negative dry film is laminated on the photo-resist layer units 35, while if the photo-resist layer units 35 are made of a negative photo-resist, a positive dry film is laminated thereon. This is for preventing the photo-resist layer units 35 from being removed along with the laminated dry film 36 during a pattern molding of the dry film 36.

After that, as shown in FIG. 3F, by removing certain regions of the laminated dry film 36, side walls 37 are formed so as to surround each device functional portion therebetween. The formation of the side walls 37 using the dry film 36 is performed in a so-called photo-process. According to such photo-process, first, light is irradiated onto the dry film 36 through a mask pattern covered on the dry film 36. The mask pattern serves to divide the dry film 36 into portions to be removed and portions not to be removed. After irradiation, a developer solution is poured onto the dry film 36 so as to melt the certain corresponding portions of the dry film 36 to be removed. Here, if the dry film 36 is a positive type, the light is irradiated onto the portions of the dry film 36 to be removed. In this case, since the photo-resist layer units 35 located under the dry film 36 are selected as a negative type, the developer solution can melt only portions of the dry film 36 located over the photo-resist layer units 35.

Subsequently, fine bores are vertically perforated from the upper surfaces of the photo-resist layer units 35 to the sacrificial layer units 32 associated thereto, respectively, so as to remove the sacrificial layer units 32 by injecting etching solution or etching gas therethrough. In this way, as shown in FIG. 3G, air gaps 38 are formed at positions of the sacrificial layer units 32 for achieving acoustic reflection.

After all of the sacrificial layer units 32 are removed, the photo-resist layer units 35 formed on the piezoelectric layer units 33 are also removed. As a result, as shown in FIG. 3H, there remains the side walls 37 on the piezoelectric layer units 33 and air gaps 38. The side walls 37 serve as protective structures for defining certain spaces there between for protecting the device functional portions including the piezoelectric layer units 33 and air gaps 38.

The formation of the protective structures is completed as a roof 39 thereof is formed by laminating a dry film over the side walls 37, as shown in FIG. 3I.

Meanwhile, the FBARs of the present embodiment comprise external electrode pads for use in a wire bonding process, which are electrically connected with the electrodes 34 of the device functional portions. In the present embodiment, since the electrodes 34 consists of internal electrodes and external electrodes, which are integrally coupled on the same plane as each other, as shown in FIG. 3J, the external electrodes are formed by merely removing the dry films, constituting the protective structures, at regular distances on the basis of boundary lines between the divided adjacent substrate sections of the substrate wafer 31, thereby allowing portions of the electrodes 34 to be exposed to the outside.

In order to improve the hardness of the protective structures, each consisting of the side walls 37 and roof 39 made of dry films, the protective structures are exposed to ultraviolet rays, so as to achieve protective structures 40 for protecting the device functional portions, respectively, during a subsequent molding process.

Upon completion of the above sequential steps, as shown in FIG. 3K, the substrate wafer 31 is cut along the boundary lines between the divided adjacent substrate sections thereof, thereby completing the formation of individual FBARs 41.

The FBARs 41 obtained according to the above sequential steps, by virtue of their protective structures 40, are adapted to protect their device functional portions when the FBARs 41 are used in other elements. Further, since the protective structures 40 are formed according to the above photo-process using dry films, the rate of generation of inferior products and defects can be reduced.

When it is desired to manufacture a duplexer device by using the FBARs 41, as shown in FIG. 3L, first, there is provided a substrate 42 comprising circuit patterns for performing a duplexing function, and a plurality of the FBARs 41 manufactured according to the present invention are mounted on the substrate 42. Then, the external electrodes of the FBARs 41 are electrically connected to printed circuit patterns formed at the substrate 42 by bonding wires 43, respectively. Although only one FBAR is shown in FIG. 3L for the convenience of understanding, it should be noted that a plurality of the FBARs 41 can be mounted on the substrate 42 in the same manner as stated above.

Subsequently, as shown in FIG. 3M, sealing material is applied onto the substrate 42 so as to completely cover the FBARs 41 mounted thereon. Through the hardening of the sealing material, a molding portion 44 is obtained.

In this case, by virtue of the protective structures 40, made of dry films, provided at the FBARs 41, the device functional portions of the FBARs 41 can be protected from any external shocks caused during the formation of the molding portion 44.

As apparent from the above description, the present invention provides an FBAR comprising a protective structure, which is obtained through a general photo-process using dry films and adapted to protect a device functional portion of the FBAR, thereby enabling precision processing of the FBAR, reducing the rate of generation of inferior products during the overall process thereof, and simplifying the overall manufacturing process compared with an existing wafer level package type FBAR. As a result, it is possible to achieve mass production of the FBAR with relatively high yields and low manufacturing costs.

Further, by manufacturing a duplexer device with the FBAR devices as stated above, it is possible to improve a profit margin of the process by reducing the rate of generation of inferior products.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claim is:

1. A method for manufacturing FBARs comprising the steps of:

a) preparing a wafer;

b) forming a plurality of sacrificial layer units on the wafer, the sacrificial layer units being spaced apart from one another at regular distances;

c) forming device functional portions on the sacrificial layer units, respectively, each device functional portion having a piezoelectric layer unit, and a plurality of electrodes;

d) forming side walls by the use of a first dry film, the side walls being configured to surround the device functional portions formed on the wafer;

e) forming air gaps by removing the sacrificial layer units, respectively;

f) laminating a second dry film over the side walls, thereby forming roofs of resulting individual packages;

g) hardening the first and second dry films forming the side walls and roofs; and h) cutting the wafer on the basis of plural vertical and horizontal lines.

2. The method as set forth in claim 1, wherein the step c) includes the steps of:
   c-1) forming a plurality of lower electrodes by applying a conductive material onto the sacrificial layer units respectively,
   c-2) forming a plurality of the piezoelectric layer units by applying a piezoelectric material onto the lower electrodes; and
   c-3) forming a plurality of upper electrodes by applying a conductive material onto the piezoelectric layer units, respectively.

3. The method as set forth in claim 1, wherein the step g) is performed by an ultraviolet exposure process.

4. The method as set forth in claim 1, wherein the step d) includes the steps of:
   d-1) forming protective layer units on a plurality of the device functional portions formed on the wafer, respectively;
   d-2) laminating the first dry film on the wafer and the protective layer units;
   d-3) removing certain portions of the first dry film positioned on the protective layer units, respectively; and
   d-4) removing the protective layer units.

5. The method as set forth in claim 4, wherein the side walls are made of a positive dry film, and the protective layer units are made of a negative photo-resist.

6. The method as set forth in claim 4, wherein the side walls are made of a negative dry film, and the protective layer units are made of a positive photo-resist.

7. A method for manufacturing an FBAR based duplexer device comprising the steps of:
   a) manufacturing one or more FBAR by using a method set forth in claim 1;
   b) preparing a printed circuit board substrate having one or more conductive patterns;
   c) die-bonding one or more of the FBARs onto the printed circuit board substrate;
   d) electrically connecting electrodes of the FBARs to corresponding ones of the conductive patterns formed at the printed circuit board substrate by bonding wires therebetween, respectively; and
   e) forming a protective layer so as to cover the printed circuit board substrate and all of the FBARs.

8. A method for manufacturing FBARs comprising the steps of:
   a) preparing a wafer,
   b) dividing the wafer into a plurality of wafer sections by the use of vertical and horizontal lines, and forming a plurality of sacrificial layer units on the divided wafer sections, respectively;
   c) forming device functional portions on the sacrificial layer units, respectively, each device functional portion including a piezoelectric layer unit and a plurality of internal electrodes, which are vertically arranged on the sacrificial layer unit, and forming a plurality of external electrodes on the divided wafer sections, the external electrodes being electrically connected to the internal electrodes and positioned close to boundary lines of the wafer sections;
   d) forming side walls by the use of a first dry film, the side walls being configured to surround the device functional portions, respectively;
   e) forming air gaps by removing the sacrificial layer units, respectively;
   f) laminating a second dry film over the side walls;
   g) removing certain portions of the second dry film on the basis of the boundary lines between the adjacent wafer sections;
   h) hardening the first and second dry films; and
   i) cutting the wafer along the boundary lines between the divided adjacent wafer sections.

9. The method as set forth in claim 8, wherein the step c) includes the steps of:
   c-1) forming a plurality of lower internal electrodes and lower external electrodes positioned on the sacrificial layer units by applying a conductive material on the sacrificial layer units, respectively, the lower external electrodes being integrally formed with the lower internal electrodes, so as to be extended to and positioned at the boundary lines between the adjacent wafer sections;
   c-2) forming a plurality of the piezoelectric layer units by applying a piezoelectric material onto the lower internal electrodes positioned on the sacrificial layer units; and
   c-3) forming a plurality of upper internal electrodes and upper external electrodes positioned on the piezoelectric layer units, the upper external electrodes being integrally formed with the upper internal electrodes, so as to be extended to the boundary lines between the adjacent wafer sections.

10. The method as set forth in claim 8, wherein the step d) includes the steps of:
    d-1) forming protective layer units on a plurality of the device functional portions, respectively;
    d-2) laminating the first dry film on the wafer and the protective layer units;
    d-3) removing certain portions of the first dry film positioned on the protective layer units, respectively; and
    d-4) removing the protective layer units.

11. The method as set forth in claim 10, wherein the side walls are made of a positive dry film, and the protective layer units are made of a negative photo-resist.

12. The method as set forth in claim 10, wherein the made of a negative dry film, and the protective layer units are made of a positive photo-resist.

13. The method as set forth in claim 8, wherein the step h) is performed by an ultraviolet exposure process.

14. An FBAR (film bulk acoustic resonator) comprising:
    a substrate having a certain size;
    a device functional portion formed at a center portion of the substrate while defining a certain air gap therein, thereby performing a resonance function by responding to electrical signals applied from the outside;
    a plurality of external electrodes formed on an upper surface of the substrate substantially coming into contact with both opposite edges of the upper surface, the external electrodes being electrically connected to the device functional portion; and
    a cap formed on the substrate, the cap including side walls configured to surround the device functional portion and a roof configured to cover over the side walls, the cap being formed by performing light-exposure, developing, and hardening processes of dry films.

15. An FBAR based duplexer device comprising:
    FBARs as set forth in claim 14;
    a printed circuit board substrate, on which the FBARs are mounted by a die bonding process, the printed circuit board substrate having one or more patterns electrically connected with external electrodes of the FBARs by bonding wires therebetween, respectively; and
    a molding portion formed on the printed circuit board substrate by applying a sealing material thereon so as to cover all of the FBARS.

* * * * *